US011355633B2

(12) United States Patent
Reznicek et al.

(10) Patent No.: US 11,355,633 B2
(45) Date of Patent: Jun. 7, 2022

(54) VERTICAL FIELD EFFECT TRANSISTOR WITH BOTTOM SOURCE-DRAIN REGION

(71) Applicant: International Business Machines Corporation, Armonk, NY (US)

(72) Inventors: Alexander Reznicek, Troy, NY (US); Ruilong Xie, Niskayuna, NY (US); Chun-Chen Yeh, Danbury, CT (US); Balasubramanian S Pranatharthi Haran, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 16/733,679

(22) Filed: Jan. 3, 2020

(65) Prior Publication Data

US 2021/0210632 A1    Jul. 8, 2021

(51) Int. Cl.
*H01L 29/78* (2006.01)
*H01L 29/08* (2006.01)
*H01L 29/10* (2006.01)
*H01L 21/02* (2006.01)
*H01L 29/66* (2006.01)

(52) U.S. Cl.
CPC ...... *H01L 29/7827* (2013.01); *H01L 21/0217* (2013.01); *H01L 21/02274* (2013.01); *H01L 29/0847* (2013.01); *H01L 29/1037* (2013.01); *H01L 29/66553* (2013.01); *H01L 29/66666* (2013.01)

(58) Field of Classification Search
CPC ............. H01L 29/7827; H01L 29/0847; H01L 29/66666; H01L 29/66575; H01L 29/66598; H01L 29/66515; H01L 29/41783; H01L 29/66636; H01L 29/66333; H01L 29/66348; H01L 29/7858; H01L 29/41791; H01L 29/78642; H01L 29/7802; H01L 29/7815; H01L 29/7395; H01L 29/7398; H01L 29/66712; H01L 29/66734; H01L 21/823814; H01L 21/823418; H01L 21/823487; H01L 21/823885; H01L 21/8224; H01L 21/82285; H01L 51/057; H01L 27/2454; H01L 27/0652; H01L 27/0658; H01L 27/0664; H01L 27/0716; H01L 27/0755; H01L 27/0777; H01L 27/0821; H01L 27/0823; H01L 27/0828; H01L 2029/7858
See application file for complete search history.

(56) References Cited

U.S. PATENT DOCUMENTS 5,914,504 A    6/1999 Augusto
5,963,800 A    10/1999 Augusto
(Continued)

*Primary Examiner* — Brigitte A Paterson
*Assistant Examiner* — Lawrence C Tynes, Jr.
(74) *Attorney, Agent, or Firm* — David K. Mattheis; Maeve M. Carpenter

(57) ABSTRACT

A semiconductor device, and method of fabricating the device. The device including a plurality of vertical transistors, each vertical transistor having a raised semiconductor island having a first cross-sectional profile, a source-drain region disposed above the raised semiconductor island, the source-drain region having a second cross-sectional profile, and a semiconductor channel disposed above the source-drain region, the semiconductor channel having a third cross-sectional profile. The second cross-sectional profile is asymmetric.

6 Claims, 17 Drawing Sheets

(56) References Cited

U.S. PATENT DOCUMENTS

| | | | |
|---|---|---|---|
| 6,207,977 B1 | 3/2001 | Augusto | |
| 7,446,025 B2 | 11/2008 | Cohen | |
| 10,014,372 B1* | 7/2018 | Leobandung | H01L 29/42356 |
| 10,236,355 B2* | 3/2019 | Cheng | H01L 21/823431 |
| 10,276,687 B1* | 4/2019 | Bao | H01L 21/02532 |
| 10,453,939 B2* | 10/2019 | Cheng | H01L 29/66666 |
| 10,505,048 B1* | 12/2019 | Xu | H01L 29/6656 |
| 10,566,331 B1* | 2/2020 | Yang | H01L 29/785 |
| 10,580,770 B2* | 3/2020 | Miao | H01L 21/823487 |
| 10,811,528 B2* | 10/2020 | Ebrish | H01L 29/0653 |
| 2004/0113207 A1 | 6/2004 | Hsu | |
| 2013/0214357 A1* | 8/2013 | Chang | H01L 29/0657 |
| | | | 438/151 |
| 2014/0008711 A1* | 1/2014 | Park | H01L 27/10841 |
| | | | 257/296 |
| 2017/0352742 A1* | 12/2017 | Cheng | H01L 29/0657 |
| 2018/0330988 A1* | 11/2018 | Boemmels | H01L 29/7827 |
| 2018/0350951 A1* | 12/2018 | Yamashita | H01L 29/165 |
| 2020/0328127 A1* | 10/2020 | Yamashita | H01L 21/265 |

* cited by examiner

VERTICAL FIELD EFFECT TRANSISTOR WITH BOTTOM SOURCE-DRAIN REGION

BACKGROUND

The disclosure relates generally to vertical field effect transistors (VTFET). The disclosure relates particularly to VTFET structures having bottom source-drain regions.

VTFET devices offer advantages in terms of device element density due to the small footprint of each device in the x-y plane of the overall system. VTFET devices include vertical fins etched in the silicon substrate with upper and lower junctions electrically connected to the fins. Source-drain regions must be present at the base of the fins for the device to function properly. VTFET devices may rely upon diffusion of dopant ions from highly doped epitaxial regions grown between the device fins to regions at the base of the respective fins to form the source-drain regions beneath the fins.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor device, and method of fabricating the device. The device including a plurality of vertical transistors, each vertical transistor having a raised semiconductor island having a first cross-sectional profile, a source-drain region disposed above the raised semiconductor island, the source-drain region having a second cross-sectional profile, and a semiconductor channel disposed above the source-drain region, the semiconductor channel having a third cross-sectional profile. The second cross-sectional profile is asymmetric.

In one aspect, a semiconductor device and method of fabricating the device. The device including a plurality of vertical transistors. Each vertical transistor includes a raised semiconductor island having a first cross-sectional profile, a first source-drain region disposed adjacent to the sides of the semiconductor island, a second source-drain region disposed adjacent to the semiconductor island and the first source-drain region, the second source-drain region having a second cross-sectional profile, and a semiconductor channel disposed above the source-drain region, the semiconductor channels has a third cross-sectional profile. The second cross-sectional profile is asymmetric.

In one aspect, a method of fabricating a semiconductor device, the method including: forming a sacrificial epitaxial layer upon a substrate, forming a channel epitaxial layer and hard mask layer upon the sacrificial epitaxial layer, forming FINs for vertical transistors, wherein the FINS comprise hard mask, channel, sacrificial and substrate layers, forming shallow trench isolation (STI) regions between FINs, wherein the STI regions cover the FIN sacrificial layers, forming protective spacers adjacent to the FIN channel and hard mask layers, selectively removing portions of the STI, exposing the FIN sacrificial layers, forming FIN support structures in alternating FIN spaces, removing FIN sacrificial layers, exposing a FIN channel layer lower surface and a FIN substrate layer upper surface, and forming a FIN source-drain region between the FIN channel layer bottom surface and the FIN substrate layer upper surface.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
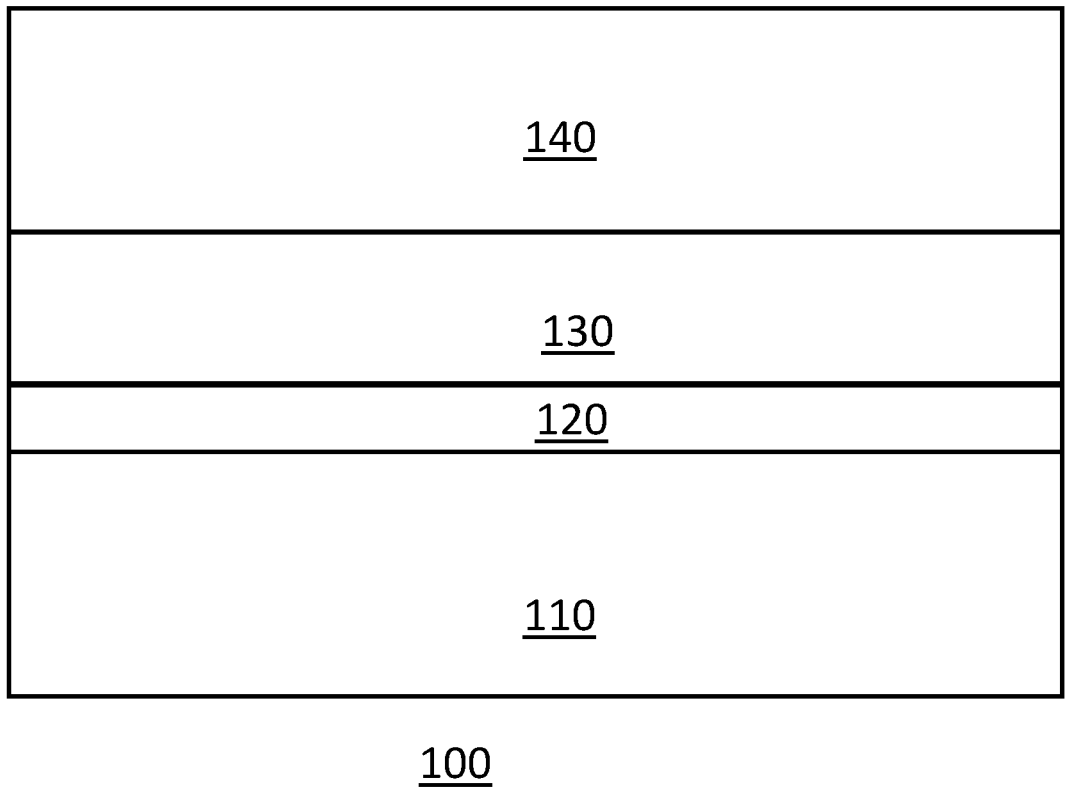
FIG. 1 provides a cross-sectional view of a step in the fabrication of a semiconductor device, according to an embodiment of the invention. The figure illustrates a formed stack including substrate, sacrificial, channel and hard mask layers.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

VTFET devices include vertical fin transistors having upper and lower source-drain junction regions. The semiconductor material of the fin cannot be grown upon a doped source-drain material. Typical VTFET transistors rely upon dopant ions diffusing from source-drain regions epitaxially grown in wells between adjacent fins to the semiconductor regions beneath the real inversion portions of the VTFET fins. The dopant ion diffusion process can be time consuming and can also yield inconsistent and unreliable results in terms of device performance. Therefore, embodiments of the present disclosure provide a method for creating a VTFET fin transistor having an epitaxially grown source-drain junction region beneath the real inversion portion of the fin. Devices having epitaxially grown source-drain regions beneath the fins have lower on-resistance and less short channel effect issues as such devices are not dependent upon the inconsistencies of the dopant diffusion process.

FIG. 1 provides a cross-sectional view of a semiconductor device 100 at an early stage of device fabrication. As shown in the figure, the cross-section includes a substrate 110. The semiconductor substrate 110 may include any semiconductor material including, for example, silicon. The term "semiconductor material" is used throughout the present application to denote a material that has semiconducting properties. Besides silicon, the semiconductor material may be strained Si, SiC (silicon carbide), Ge (germanium), SiGe (silicon germanium), SiGeC (silicon-germanium-carbon), Si alloys, Ge alloys, III-V semiconductor materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements.

A sacrificial semiconductor material layer 120, is epitaxially grown upon the substrate. In an embodiment, the sacrificial semiconductor layer composed of a silicon germanium alloy. In an embodiment, the SiGe alloy of sacrificial semiconductor material layer 120 has a germanium content that is greater than 50 atomic percent germanium. In such an embodiment, the SiGe alloy of the sacrificial semiconductor material layer 120 has a germanium content that is less than 50 atomic percent germanium. In one example, the SiGe alloy of the sacrificial semiconductor material layer 120 has a germanium content from 20 atomic percent germanium to 40 atomic percent germanium. In one example, the SiGe alloy that provides each sacrificial semiconductor material layer 120 has a germanium content of about 35 atomic percent germanium. The first semiconductor material of the sacrificial semiconductor material layers 120 can be formed utilizing an epitaxial growth (or deposition process) as defined in greater detail herein below. In an embodiment, sacrificial semiconductor material layer 120 has a height or vertical thickness in a Z or surface normal direction ranging from about 10 nanometers (nm) to about 60 nm.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

As shown in the figure, semiconductor material layer 130 is epitaxially grown upon the sacrificial semiconductor layer 120. Semiconductor layer 130 includes a material such as that of substrate 110 described above. In an embodiment, semiconductor material layer 130 has a height or vertical thickness in a Z or surface normal direction ranging from about 10 nm to about 60 nm. Hard mask layer 140 is disposed upon semiconductor layer 130. In an embodiment, hard mask 140 includes a nitride, oxide, an oxide-nitride bilayer, or another suitable material. In some embodiments, the hard mask 140 may include an oxide such as silicon oxide (SiO), a nitride such as silicon-nitride (SiN), an oxynitride such as silicon oxynitride (SiON), combinations thereof, etc. In some embodiments, the hard mask 140 is a silicon-nitride such as $Si_3N_4$. The hard mask 140 has a height or vertical thickness in a Z or surface normal direction ranging from about 20 nm to about 150 nm.

Figure 2:
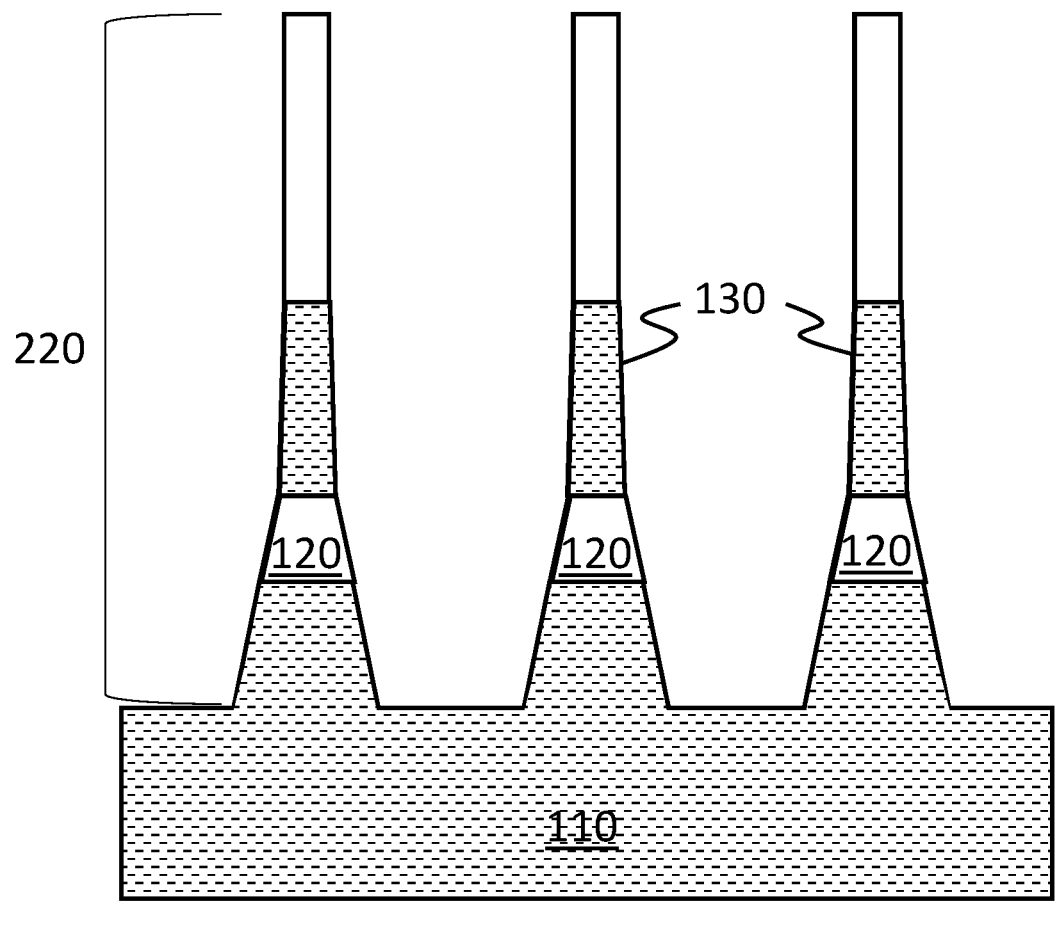
FIG. 2 provides a cross-sectional view of a step in the fabrication of a semiconductor device, according to an embodiment of the invention. The figure illustrates patterned and etched vertical transistor FINs.

FIG. 2 illustrate a stage in the device 100 fabrication process. As shown in the figure, substrate 100, sacrificial semiconductor material layer 120, semiconductor layer 130, and hard mask 140 have been patterned and etched to produce FINs 220 for the semiconductor device. Each fin 220 includes an island or channel of substrate material supporting fin layers of the sacrificial semiconductor material layer 120, semiconductor layer 130, and hard mask 140.

As shown in the figure, the island of substrate material has a first cross-sectional profile as the foundation of the fin 220. The sacrificial layer portion above the island has a second cross-sectional profile and the semiconductor layer 130 portion of the fin has a third cross-sectional profile.

This etching can be performed using a timed anisotropic etch such as reactive ion etching (RIE). The etch can be performed in a single etch that removes material from hard mask 140, semiconductor layer 130, sacrificial semiconductor material layer 120, and substrate 110 in a single process step, alternatively, the removal is performed using etching processes that selectively affect the hard mask 140, semiconductor material layer 130, sacrificial semiconductor material layer 120 and substrate 110 in turn.

Figure 3:
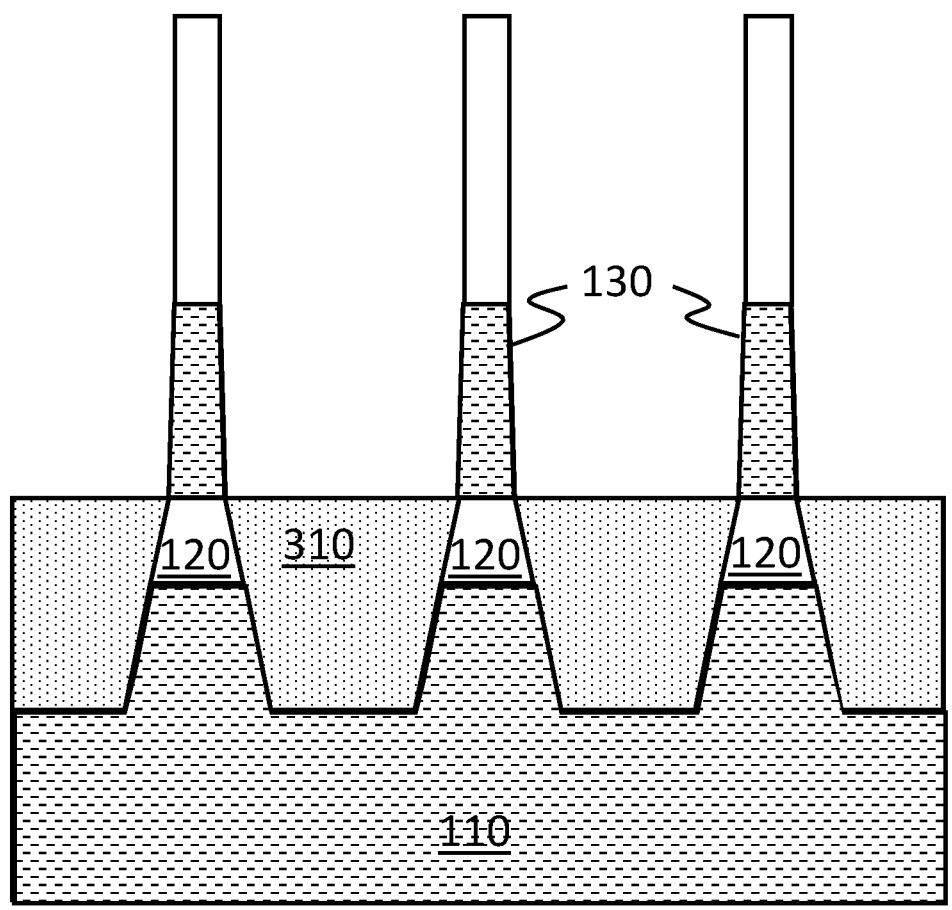
FIG. 3 provides a cross-sectional view of a step in the fabrication of a semiconductor device, according to an embodiment of the invention. The figure illustrates the device after the addition of shallow trench isolation (STI) material.

FIG. 3 illustrates the process after the formation of shallow trench isolation (STI) material in regions between the substrate islands and sacrificial layers 120 of FINs 220. The STI regions 310 can be formed by, any suitable process including, for example, lithography or etching to form trenches, and then filling the trenches with an insulating material, such as silicon dioxide, followed by chemical mechanical polishing (CMP) and oxide recess. The STI regions 310 provide isolation between neighboring FINs 220. After STI recess, the target upper level of STI is about co-planar with the upper surfaces of the sacrificial semiconductor material layer 120 portions of the FINs 220.

Figure 4:
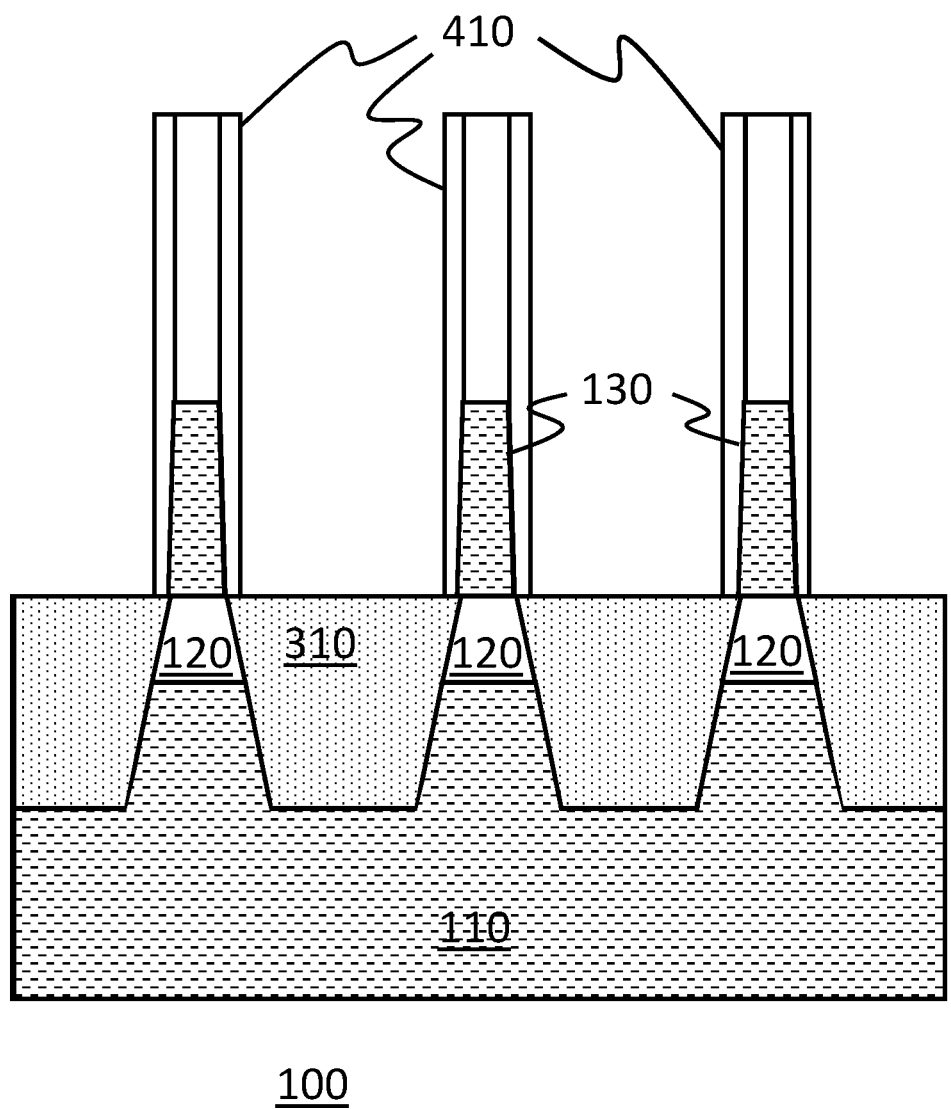
FIG. 4 provides a cross-sectional view, of a step in the fabrication of a semiconductor device, according to an embodiment of the invention. The figure illustrates the device after the addition of channel spacer isolation material.

As shown in FIG. 4, protective spacers 410 are disposed upon the vertical surfaces of the FINs 220. In an embodiment, the dielectric material of spacers 410 includes silicon dioxide, or SiCO, or SiC or any another suitable dielectric material or combination disposed upon the structure. In an embodiment, the spacers 410 are formed by alternating deposition processes including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition. After the spacers 410 are deposited, horizontal portions of the deposited dielectric material are removed using anisotropic etching methods such as RIE described above.

Figure 5:
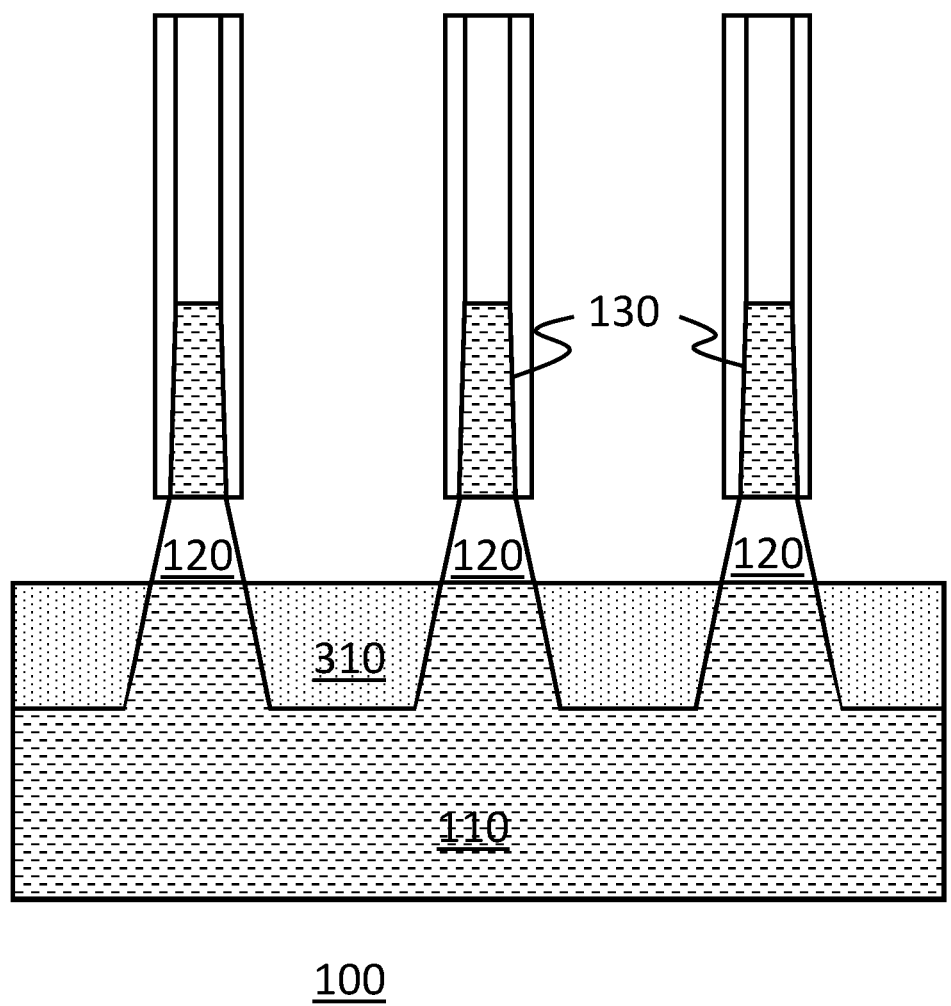
FIG. 5 provides a cross-sectional view of a step in the fabrication of a semiconductor device, according to an embodiment of the invention. The figure illustrates the device after the selective removal of a portion of the STI, exposing the sacrificial layers of the FINs.

As show in FIG. 5, subsequent to the formation protective spacers 410, the STI material is etched such that the upper surfaces of the STI portions 210 are about co-planar with the lower surfaces of the sacrificial semiconductor material layer 120 portions of the FINs 220. In an embodiment, the STI region 210 portions are etched using RIE or similar known isotropic etching methods.

Figure 6:
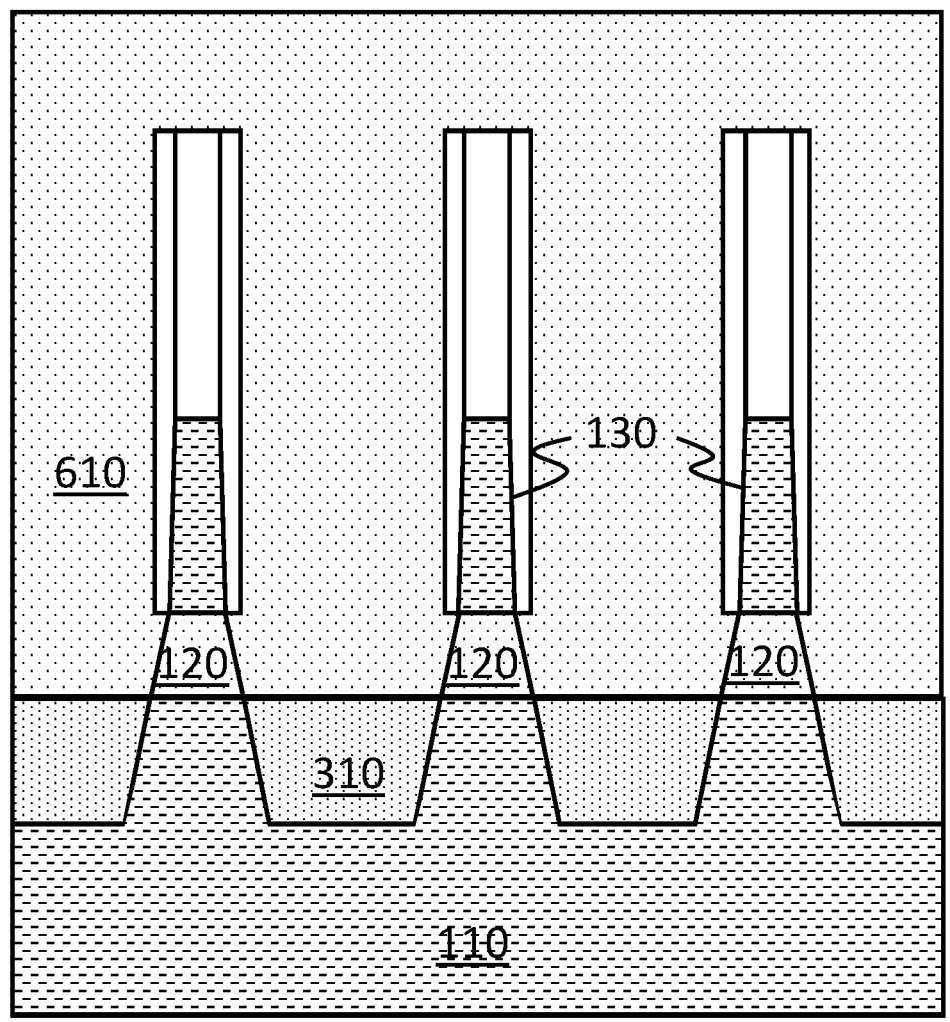
FIG. 6 provides a cross-sectional view of a step in the fabrication of a semiconductor device, according to an embodiment of the invention. The figure illustrates the device after the addition of channel FIN support material.
Figure 7:
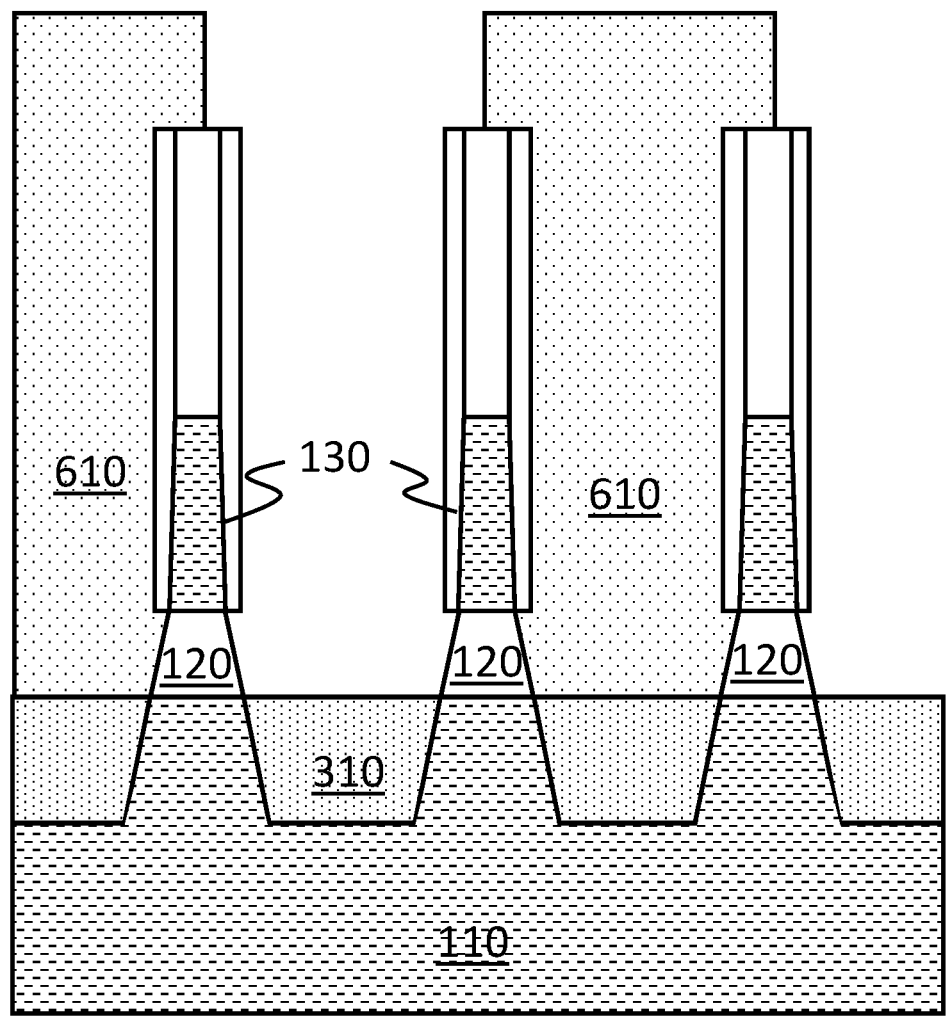
FIG. 7 provides a cross-sectional view of a step in the fabrication of a semiconductor device, according to an embodiment of the invention. The figure illustrates the device after the selective removal of a portion of the channel FIN support material, exposing the sacrificial layers of the FINs.

As shown in FIG. 6, sacrificial support material 610 is deposited around the FINs 220. In an embodiment, sacrificial support material includes spin on carbon (SOC). In this embodiment, the SOC is deposited, patterned and removed yielding support structures disposed between alternating FINs 220 while exposing alternating portions of the sacrificial semiconductor layer 120 portions of the FINs 220 as shown in FIG. 7.

Figure 8:
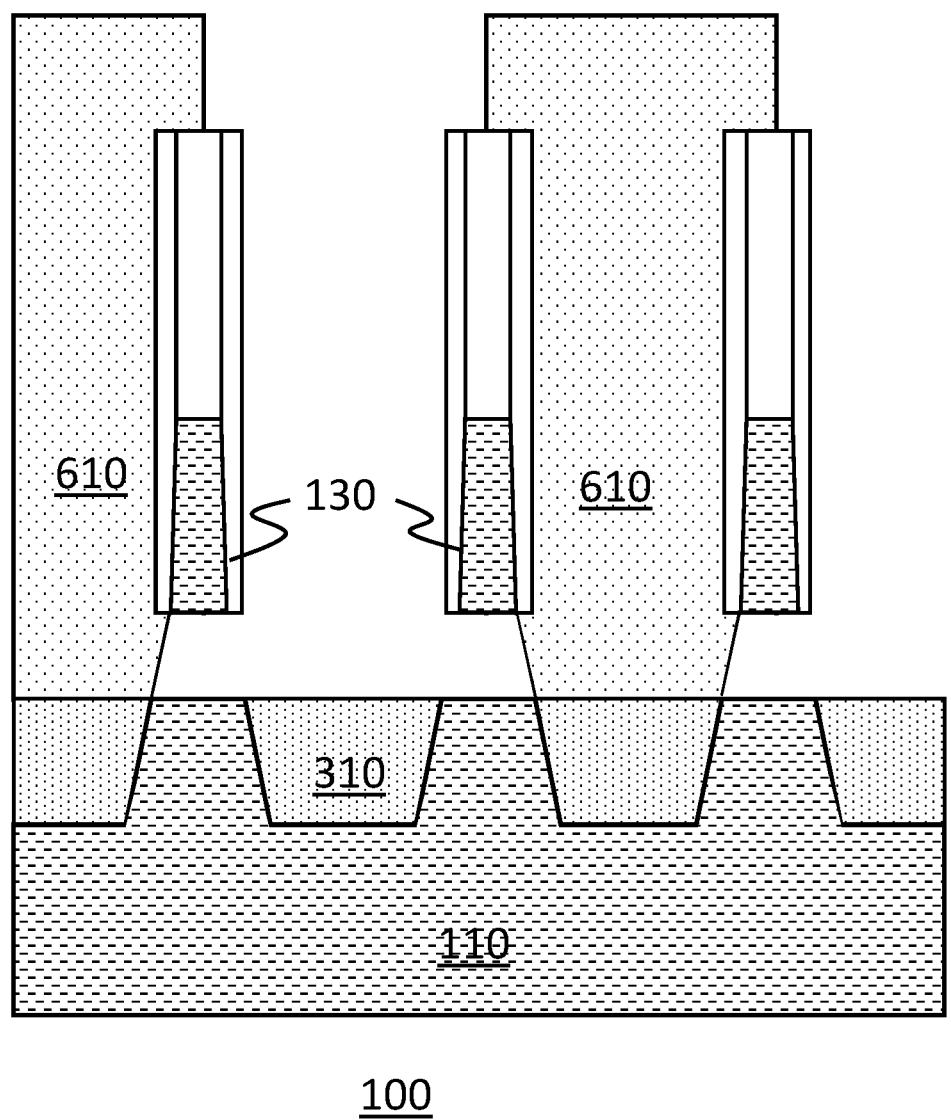
FIG. 8 provides a cross-sectional view of a step in the fabrication of a semiconductor device, according to an embodiment of the invention. The figure illustrates the device after the removal of the sacrificial layers of the FINs.

As shown in FIG. 8, the sacrificial semiconductor layer 120 portions of the FINs 220 have been selectively etched away, exposing the lower surfaces of FIN semiconductor layer 130, and upper surfaces of substrate layer 110. These surfaces are suitable starting regions for the epitaxial growth of doped source-drain regions.

Figure 9:
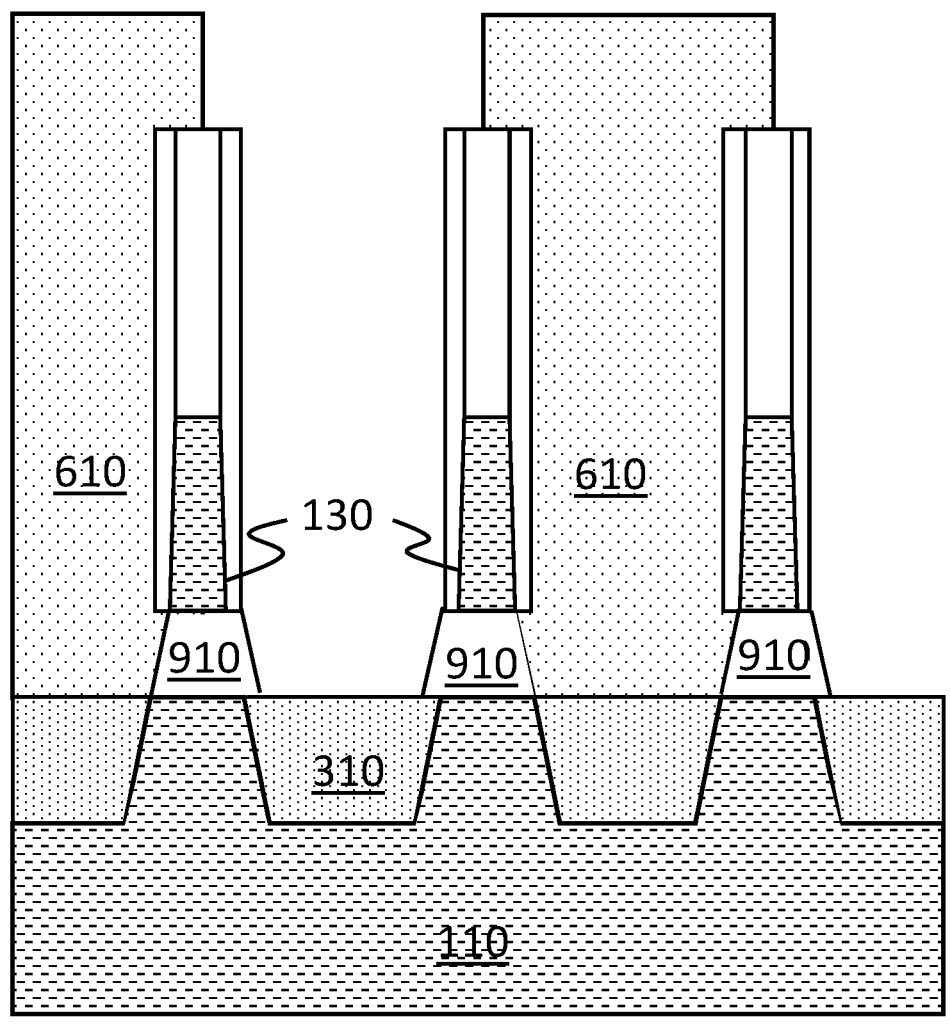
FIG. 9 provides a cross-sectional view of a step in the fabrication of a semiconductor device, according to an embodiment of the invention. The figure illustrates the device after the epitaxial growth of FIN source-drain regions.

As shown in FIG. 9, source-drain regions 910 are epitaxially grown between the uppermost surfaces of the substrate 110 and the lower surfaces of the semiconductor material layer 130 of the FINs 220. In the present embodiments, the source-drain regions 910 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor in a silicon containing substrate examples of n-type dopants, i.e., impurities, include but are not limited to antimony, arsenic and phosphorous.

Figure 10:
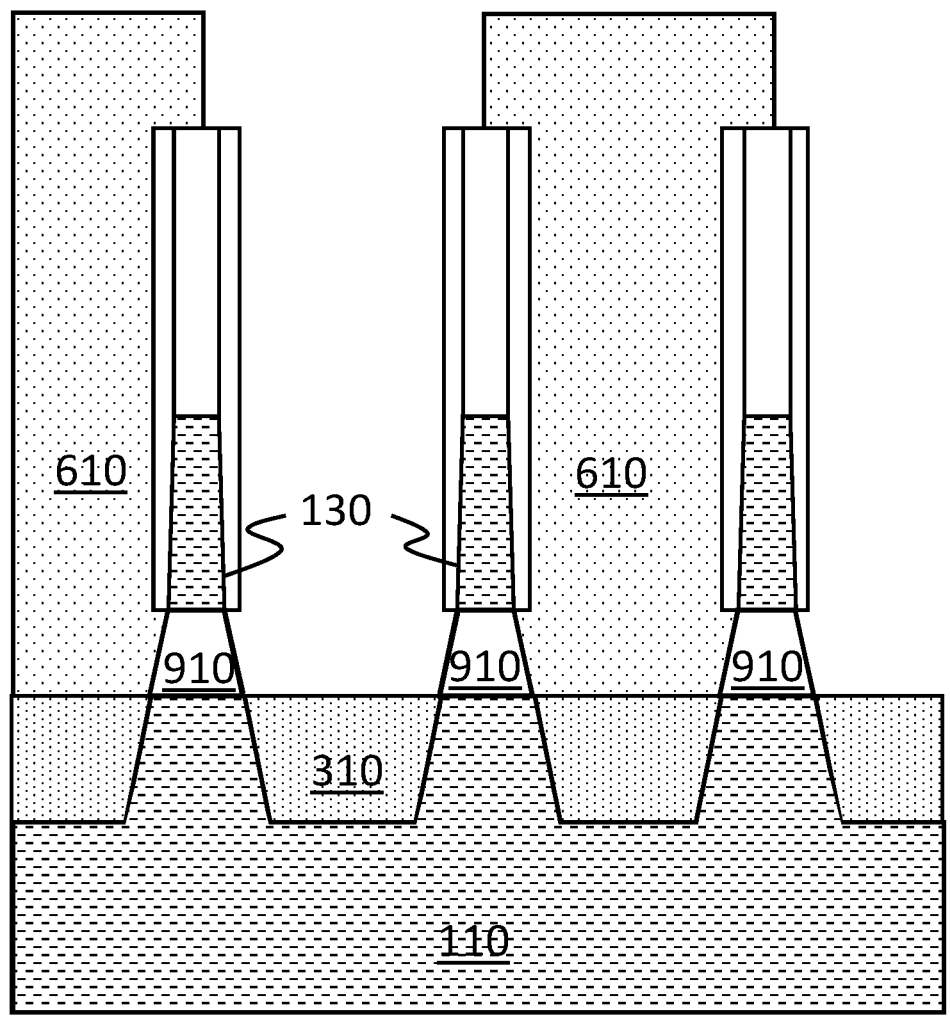
FIG. 10 provides a cross-sectional view of a step in the fabrication of a semiconductor device, according to an embodiment of the invention. The figure illustrates the device after the optional selective removal of a portion of source-drain regions.

The cross-sectional profile of the doped epitaxially grown source-drain regions matches or exceeds the cross-sectional profile of the original sacrificial layer portion. In an embodiment, the epitaxial growth continues to an extent that the cross-sectional profile of the doped region exceeds that of the original sacrificial portion. In an embodiment, the excess doped region is trimmed away, leaving a doped region having the cross-sectional profile of the original sacrificial region. As shown in FIG. 10, excess source-drain epitaxial growth may be trimmed from the lower source-drain regions 910 by appropriate etching method as described above. In an embodiment, the doped region is trimmed leaving an asymmetrical cross-sectional profile. In this embodiment, the cross-sectional asymmetry yields a doped region extending beyond the cross-sectional profile of the semiconductor portion of the fins, away from the side of the fins which were supported by the sacrificial support material. In an embodiment, the asymmetric portion extending beyond the cross-sectional profile of the semiconductor portion of the fins alternates among adjacent fins from one side of the cross-section to the other side of the cross-section.

Figure 11:
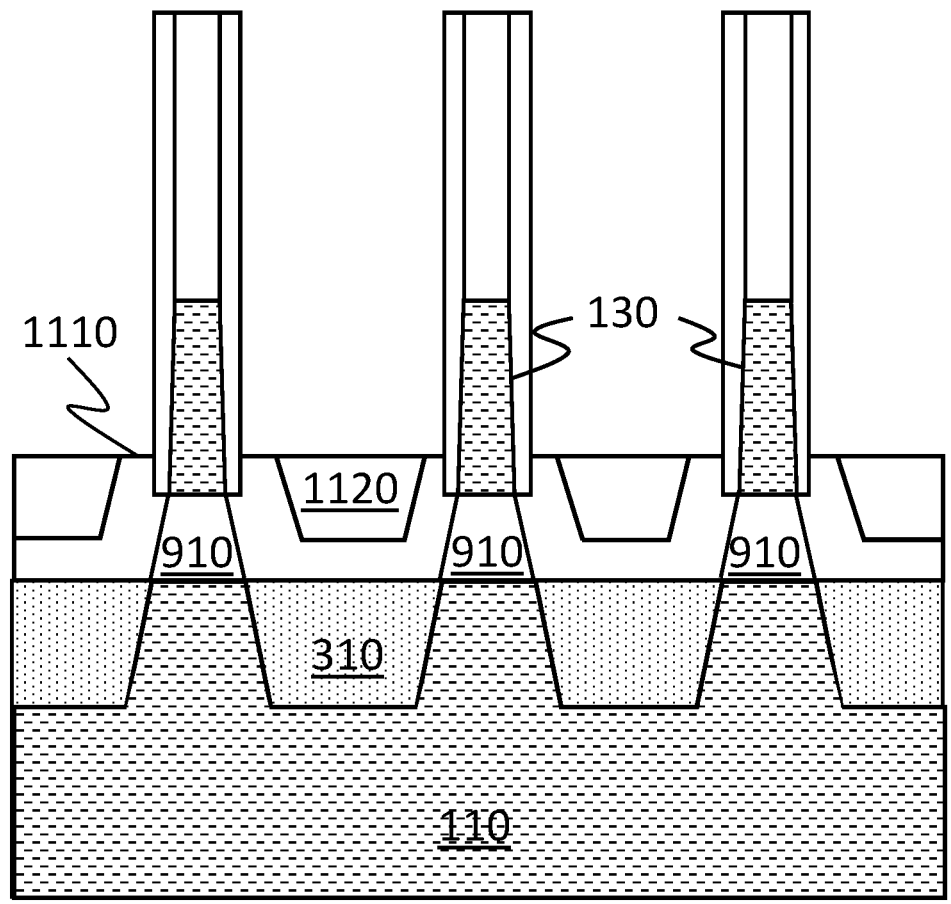
FIG. 11 provides a cross-sectional view of a step in the fabrication of a semiconductor device, according to an embodiment of the invention. The figure illustrates the device after the removal of the remaining channel FIN support material and the deposition of bottom spacers between adjacent FINs.

As shown in FIG. 11, sacrificial support material 610 portions have been removed and first bottom spacer layer 1110 and second bottom spacer layer 1120 have been deposited. In an embodiment, sacrificial material 610 portions are removed by an ashing process. The first bottom spacer layer 1110 includes, for example, silicon-nitride deposited using atomic layer deposition, and the second bottom spacer layer 1120 includes, for example, silicon-oxide deposited using a high-density plasma chemical vapor deposition process. After the two deposition processes are completed, silicon-nitride present upon FIN 220 vertical surfaces and unshielded by the silicon-oxide of the second bottom spacer layer 1120, is etched away.

In fabrication steps not shown, hard mask portions 140 (FIG. 1) of the FINs are etched away, upper source-drain regions are epitaxially grown from the uppermost surfaces of the FINs 220, a high-k dielectric layers is deposited upon the structure, a work function metal layers is deposited upon the plurality of FIN 220 devices and selectively etched away in the areas on second bottom spacer layer 1120. An isolation layer dielectric is then deposited over the structure. Vias are etched in the isolation layer dielectric and contacts are formed between the upper surface of the isolation layer dielectric and the upper and lower source-drain regions as well as the gate surfaces.

Figure 12:
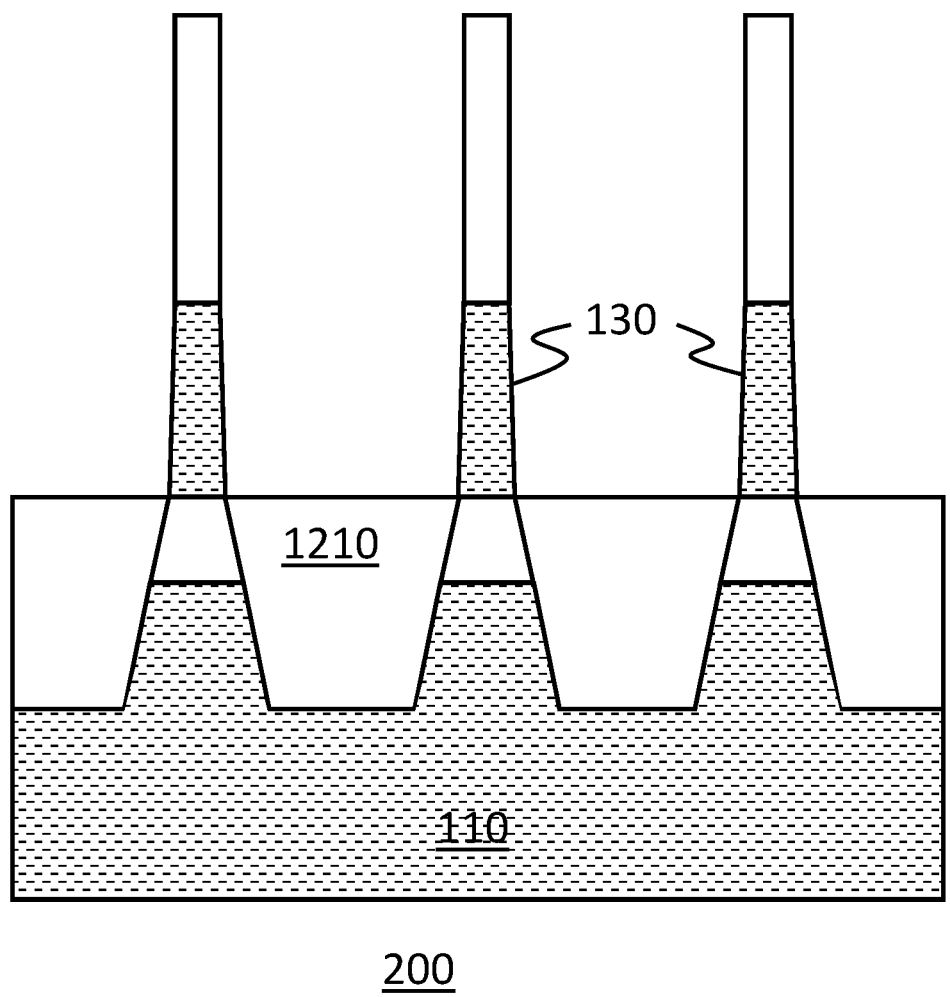
FIG. 12 provides a cross-sectional view of a step in the fabrication of a semiconductor device, according to an embodiment of the invention. The figure illustrates the device after the deposition of a doped S-D layer between FINs.

As shown in FIG. 12, illustrating an alternative embodiment, device 200, after the FINs 220 are formed, a second epitaxial material layer 1210 of doped source-drain material is grown upon the substrate layer 110. Second semiconductor material layer 1210 is trimmed and planarized to the level of the upper surface of the sacrificial semiconductor portions of the FINs 220.

Figure 13:
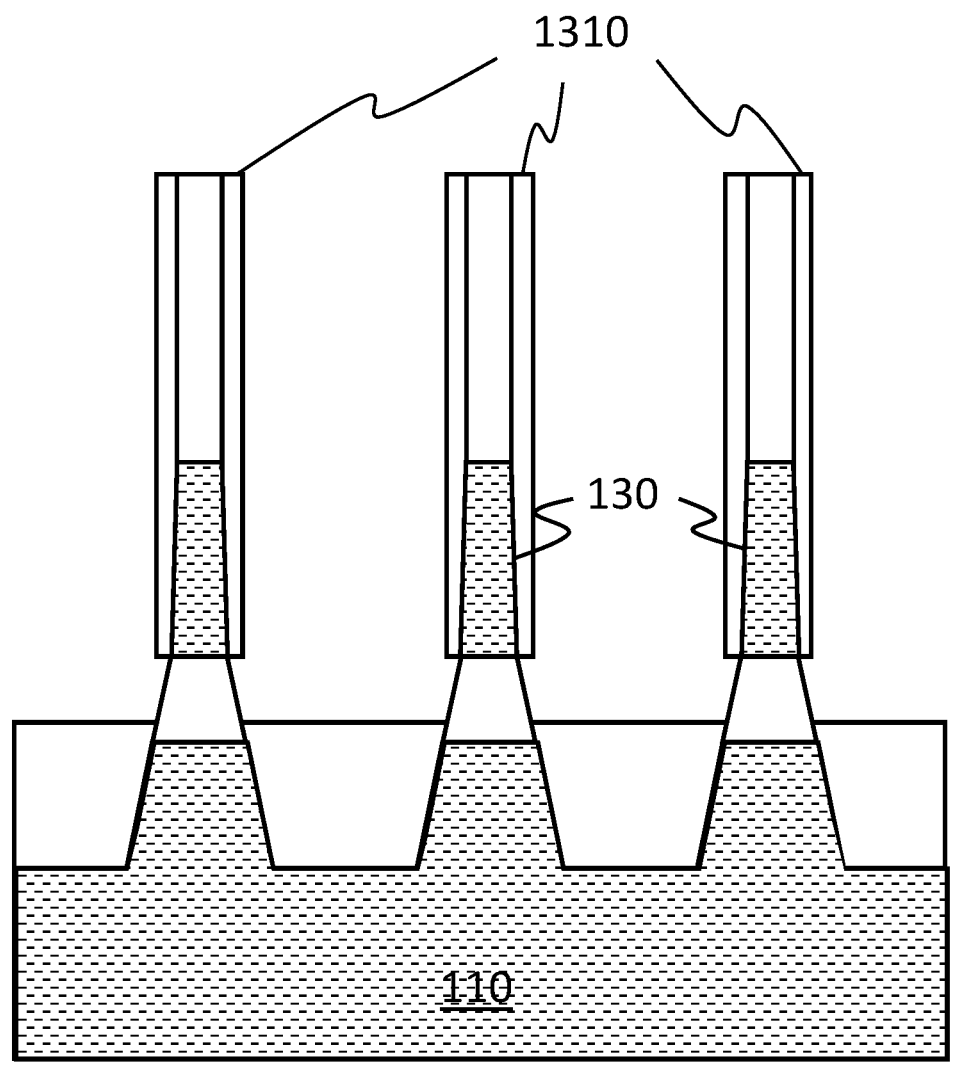
FIG. 13 provides a cross-sectional view of a step in the fabrication of a semiconductor device, according to an embodiment of the invention. The figure illustrates the device after the deposition of side spacers and the trimming of the doped S-D layer.

As shown in FIG. 13, vertical dielectric spacers 1310 are then formed as described above. After vertical spacer formation, portions of the second semiconductor material 1210 are etched away such that the upper surface of the second semiconductor source-drain material layer 1210 is below the upper surface of sacrificial semiconductor material layer 120, and above the lower surface of the sacrificial semiconductor layer 120.

Figure 14:
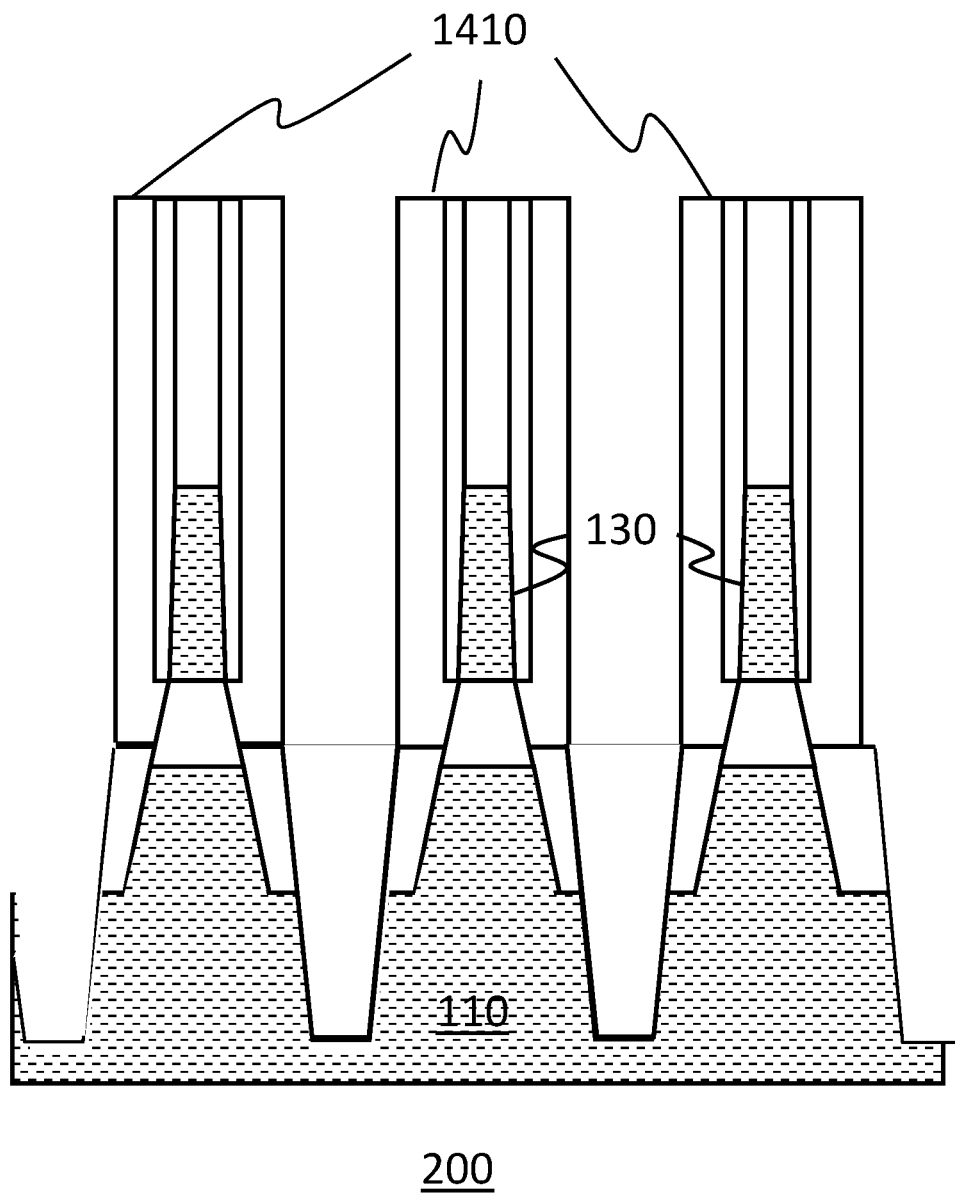
FIG. 14 provides a cross-sectional view of a step in the fabrication of a semiconductor device, according to an embodiment of the invention. The figure illustrates the device after the deposition of a sacrificial liner and RIE etching of STI trenches in the inner material, source-drain layer and substrate layer.

As shown in FIG. 14, additional spacers 1410 are formed by depositing a material such as SiN SiO2, SiCO, SiC, AlOx, TiOx, etc, which is then patterned and etched to create trenches for STI material which is deposited.

Figure 15:
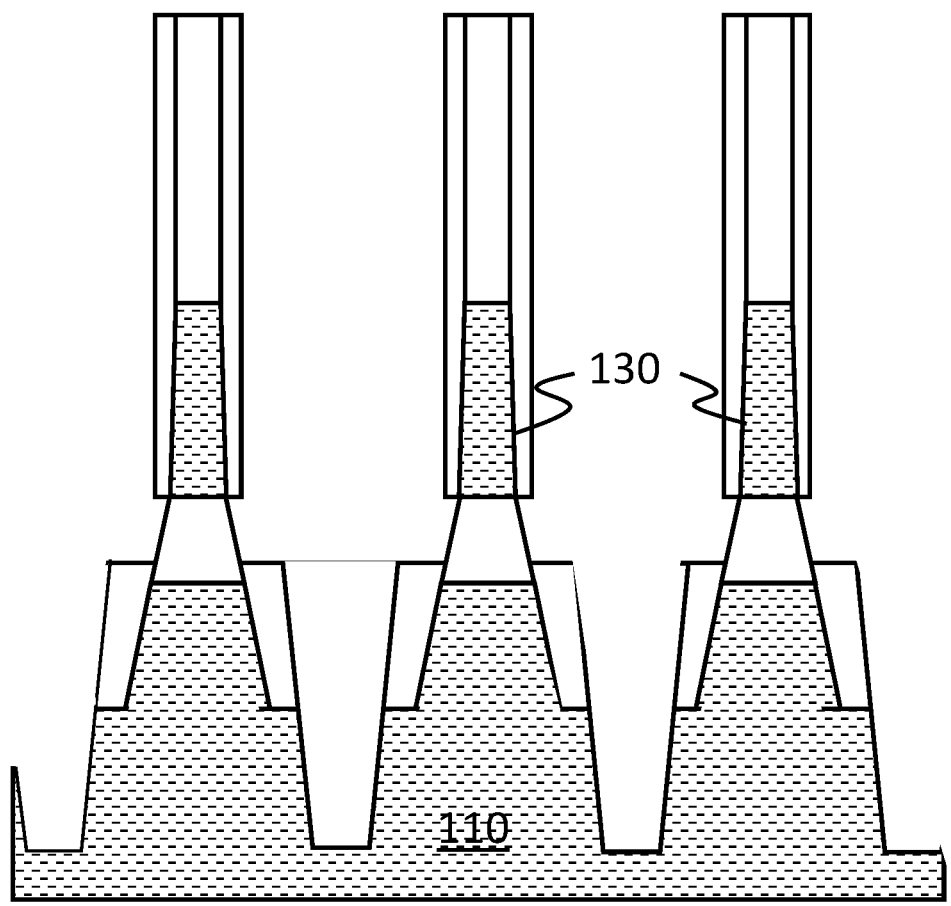
FIG. 15 provides a cross-sectional view of a step in the fabrication of a semiconductor device, according to an embodiment of the invention. The figure illustrates the device after the deposition of STI dielectric material and the removal of the sacrificial liner material.

As shown in FIG. 15, STI is formed, and the additional spacers 1410 are then removed. The STI material is recessed to the level of the second epitaxially grown semiconductor source-drain material layer 1210 as described above.

Figure 16:
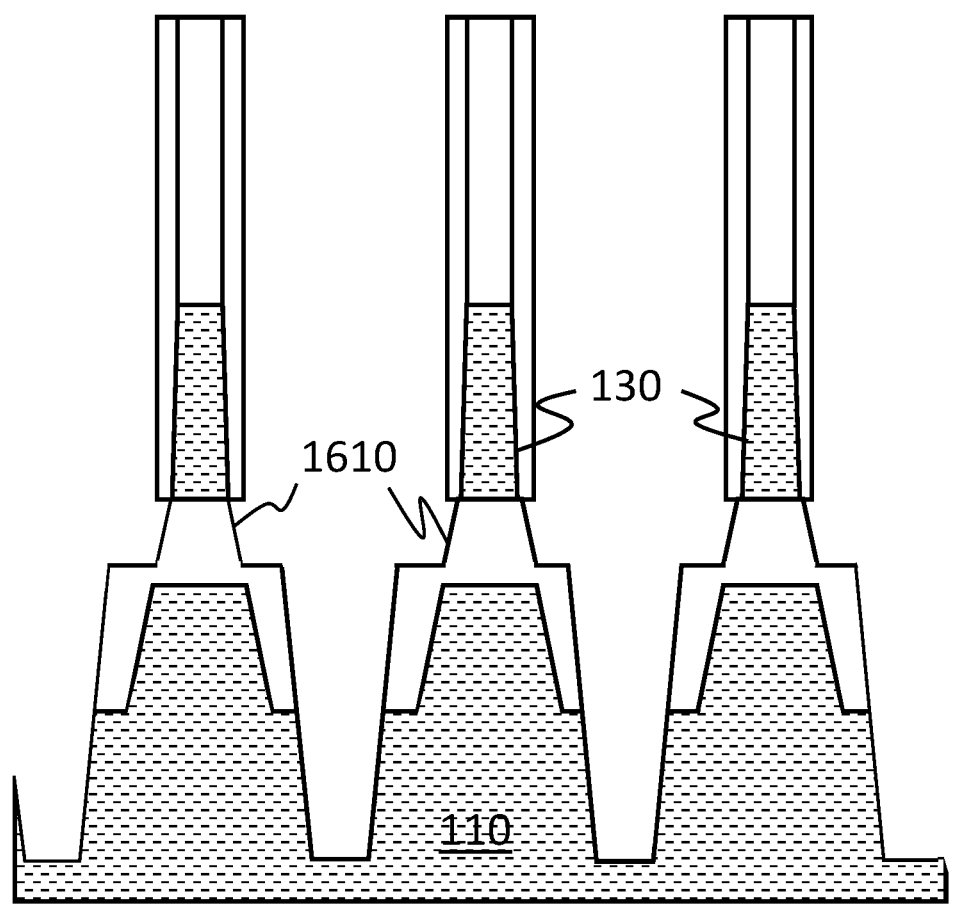
FIG. 16 provides a cross-sectional view of a step in the fabrication of a semiconductor device, according to an embodiment of the invention. The figure illustrates the device after the removal of the sacrificial epitaxial layer, the deposition of bottom S-D regions beneath the FINs, and the deposition of bottom spacers between FINs.

As shown in FIG. 16, the sacrificial semiconductor material layer 120 material is selectively removed, additional source-drain material is epitaxially grown between the substrate upper surface, the second epitaxially grown source-drain material 1610, and the lower surface of the FINs 220. In an embodiment, the lower source-drain region includes substantial surface area in contact with the substrate 110 layer. In this embodiment, the device may be finished as described above.

Figure 17:
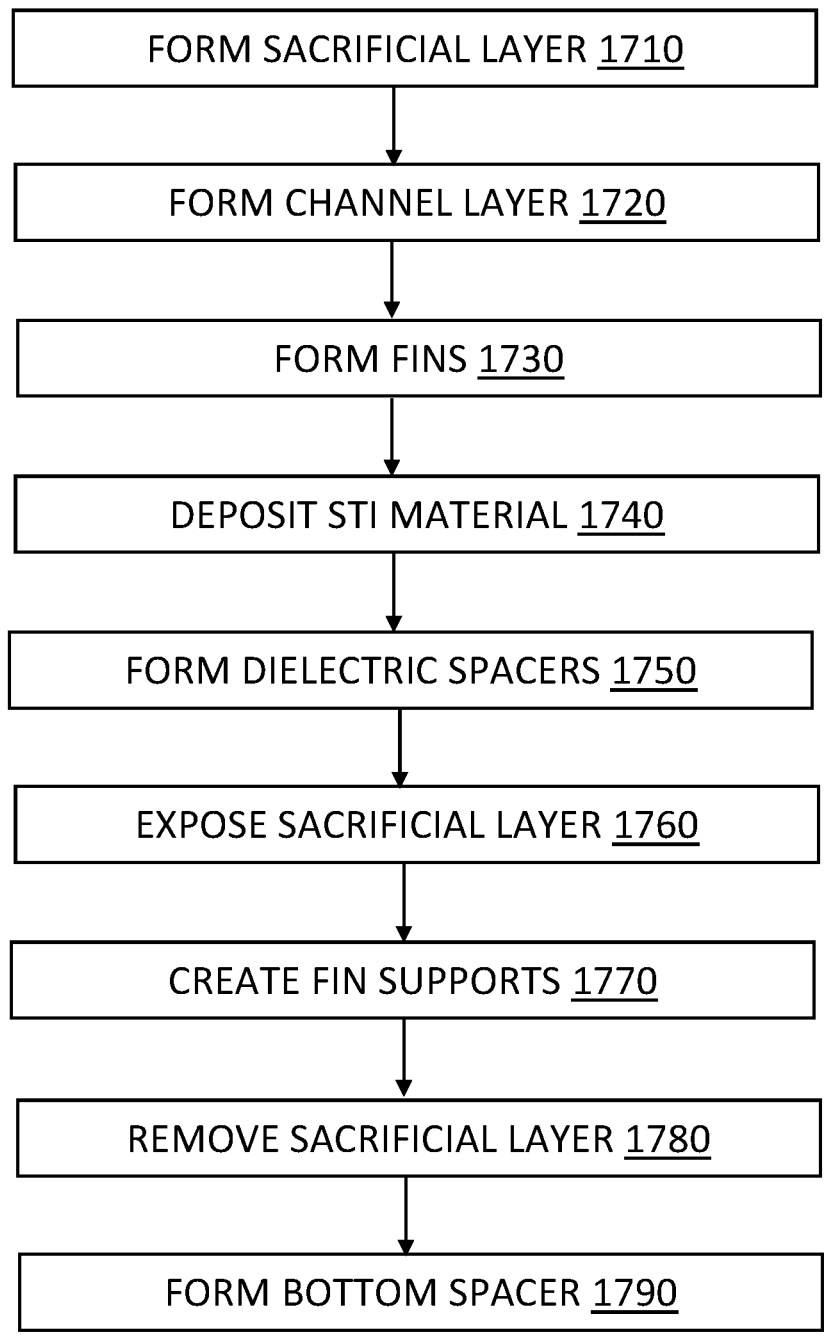
FIG. 17 provides a flowchart depicting operational steps for forming semiconductor device, according to an embodiment of the invention.

FIG. 17 provides a flowchart of fabrication steps 1700, according to an embodiment of the invention. As shown in the figure, at block 1710, a sacrificial crystalline semiconductor layer is epitaxially grown upon a crystalline semiconductor substrate. In an embodiment, the sacrificial layer includes crystalline silicon-germanium.

At block 1720, a channel layer of crystalline semiconductor material, generally similar to the crystalline semiconductor material of the substrate layer, is epitaxially grown upon the sacrificial crystalline semiconductor layer. In an embodiment, a hard mask layer is also deposited upon the channel layer using known deposition methods.

At block 1730, a plurality of FINs are formed for the device. The FINs are formed by removing portions of the hard mask, channel, sacrificial and substrate layers using selective wet or dry etching techniques. At block 1740, shallow trench isolation (STI) regions are deposited between device FINs. In an embodiment, the STI material covers the sacrificial layers of the FINs.

At block 1750, a layer of dielectric material is deposited and selectively patterned and removed to form side spacers upon the vertical surfaces of the FINs. At block 1760, the STI material is trimmed to expose the sacrificial crystalline semiconductor layers of the FINs.

At block 1770, FIN supports are formed anchoring the channel and hard mask layers of the fins to the substrate and STI material portions. In an embodiment, the FIN support material includes spin on carbon. After the support material is deposited, portions of the material are removed between alternating FINs exposing the sacrificial FIN layers and the STI material.

At block 1780, the sacrificial layers of the FINs are selectively etched away, exposing the upper surface of the substrate portions of the FINs and the lower surface of the channel layers of the FINs. At block 1790, a doped crystalline source-drain layer is epitaxially grown between the substrate and channel portions of the FINs. In an embodiment, the epitaxially grown doped semiconductor source-drain regions are trimmed to conform to the contour profile of the FINs. After trimming, the remaining FIN support material is removed. In an embodiment, the support material is removed by ashing the material.

After the removal of the support material, bottom spacer dielectric isolation layers are deposited between the FINs. The hard mask layer is removed, an upper S-D region is added to the top of the FINs, and the gate structures are completed by adding a high-k dielectric layer and a work function metal layer. The completed gates are then encapsulated with an isolation layer dielectric layer and appropriate S-D and gate contacts.

In an alternative embodiment, after the FINs are formed, a first doped source-drain layer is epitaxially grown upon the substrate between the FINS and covering the sacrificial layers of the FINs. In this embodiment, the dielectric spacers are formed on the vertical surfaces of the FINs. The S-D layer is etched backed to a level below the upper surface of the sacrificial semiconductor layer of the FINs and above the lower surface of the sacrificial layer of the FINs. Sacrificial sidewall material is then added to the vertical surfaces of the FINs. Trenches are then formed in the sacrificial sidewall material, the S-D layer and the substrate for the deposition of STI material. The sacrificial sidewall spacer material is subsequently removed and the STI material is trimmed back to the level of the S-D material. The sacrificial semiconductor layers of the FINs are then etched away leaving voids between the substrate islands of the FINs, the S-D layer, and the lower surface of the channel layer of the FINs. A second S-D layer is then epitaxially grown in these voids creating an electrically conductive junction between the channel layer and the substrate semiconductor islands of the FINs.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising a plurality of vertical transistors, each vertical transistor comprising:
    a raised semiconductor island having a first cross-sectional profile;
    a source-drain region disposed above the raised semiconductor island, the source-drain region having a second cross-sectional profile;
    a semiconductor channel disposed above the source-drain region, the semiconductor channel having a third cross-sectional profile; and
    wherein the second cross-sectional profile is asymmetric such that the second cross-sectional profile extends beyond an edge of the third cross-sectional profile, wherein the asymmetric edge among adjacent vertical transistors alternates from a first side of a vertical transistor to a second side of the adjacent vertical transistor.

2. The semiconductor device according to claim 1, wherein the second cross-sectional profile comprises a symmetric edge which follows a contour of the first and third cross-sectional profiles, and an asymmetric edge which does not follow the contour.

3. The semiconductor device according to claim 1, wherein the source-drain region comprises a doped semiconductor material.

4. The semiconductor device according to claim 1, further comprising a dielectric spacer disposed between vertical transistors.

5. The semiconductor device according to claim 4, wherein the dielectric spacer comprises silicon-nitride.

6. The semiconductor device according to claim 4, wherein the dielectric spacer comprises silicon-oxide.

* * * * *